United States Patent [19]
Negishi et al.

[11] Patent Number: 5,528,241
[45] Date of Patent: Jun. 18, 1996

[54] DIGITAL-TO-ANALOG CONVERTER

[75] Inventors: Nobuji Negishi, Tokyo, Japan; Marcel J. M. Pelgrom, Eindhoven, Netherlands; Raymond Speer, Dublin, Ireland; Jurgen H. T. Geerlings, Vienna, Austria

[73] Assignee: U. S. Philips Corporation, New York, N.Y.

[21] Appl. No.: 230,941

[22] Filed: Apr. 21, 1994

[30] Foreign Application Priority Data

Apr. 21, 1993 [JP] Japan ........................ 5-117964

[51] Int. Cl.6 .................................. H03M 1/66
[52] U.S. Cl. .................................. 341/144; 341/153
[58] Field of Search .................. 341/118, 144, 341/145, 153

[56] References Cited

U.S. PATENT DOCUMENTS 5,079,552   1/1992   Pelgrom et al. .................... 341/148
5,126,740   6/1992   Kawada ............................. 341/144
5,175,548  12/1992   Kawada ............................. 341/144

FOREIGN PATENT DOCUMENTS 62-193008   7/1989   Japan .
2079080     1/1982   United Kingdom .

Primary Examiner—Marc S. Hoff
Attorney, Agent, or Firm—Bernard Franzblau

[57] ABSTRACT

A digital-to-analog converter having a ladder resistor portion for generating a plurality of quantization signals of predetermined values based on reference signals of predetermined values and a quantization switch portion for selectively outputting one of the quantization signals in accordance with a digital input value. The ladder resistor portion is coupled to at least one resistor for generating a signal of a value which corresponds to a desired signal level of a signal to be added. A switch provided for supplying the signal of the value corresponding to the desired signal level to an output of the switch portion in response to a timing signal synchronized with the signal to be added.

16 Claims, 2 Drawing Sheets

DIGITAL-TO-ANALOG CONVERTER

BACKGROUND OF THE INVENTION

1. Field of the Invention

This invention relates to a digital-to-analog (D/A) converter suitable for use where a video signal digitally processed in a video camera or the like is convened into an analog signal.

2. Prior Art

In particular this invention relates to a digital-to-analog converter having a ladder resistor portion for generating a plurality of quantization signals of predetermined values based on a reference signal and a quantization switch portion for selectively outputting one of the quantization signals in accordance with a digital input value.

Such a digital-to-analog converter is known from U.S. Pat. No. 5,079,552.

In accordance with the recent expansion of the application field of the digital signal processing IC's, a significant progress has been achieved in the digital processing of video signals in consumer-use portable apparatuses such as portable video cameras (or camcorders). The video signal digitally processed in such a camcorder is generally convened into an analog video signal by a D/A converter in order to obtain a standard analog recording signal.

A luminance signal, for example, of the video signal in such a digital signal processing IC as described above is usually represented in eight bits and is converted into an analog signal by means of a D/A converter incorporated in the IC. The analog luminance signal thus obtained and outputted from the IC is combined with a synchronization signal with the aid of other circuit components and is thereafter supplied, for example, to a frequency converter.

It would not be very efficient in the miniaturization of a camcorder or the like to provide separate circuit components, in addition to the digital processing IC, only for the purpose of adding a synchronization signal as described above. On the other hand, for the incorporation of a synchronization-signal, addition circuit into a digital video signal processing IC, a special measure has to be taken to overcome the restrictions of space in the IC.

SUMMARY OF THE INVENTION

It is therefore an object of the present invention to provide a D/A converter which can add, when converting a digital signal such as a luminance signal of a digital video signal into an analog signal, a further signal to the analog signal with a minimum circuit structure.

To achieve the above object, a digital-to-analog converter provided in accordance with the present invention is characterized in that at least one resistor is coupled to the ladder resistor portion for generating a signal whose value corresponds to a desired signal level of a signal to be added, and in that a switch means is provided for supplying, in response to a timing signal synchronized with said signal to be added, said signal of the value corresponding to the desired signal level to an output of the switch portion.

With the above structure, only the resistor to be coupled to the ladder resistor portion and the switch means for supplying a voltage generated by this resistor to the output terminal of the switch portion need to be provided. Therefore, the present invention can be implemented even in the case where space is very limited, such as in an integrated circuit, to add a further signal to the analog output signal.

In the above case, the digital-to-analog converter may be further characterized in that the ladder resistor portion is constructed to generate a plurality of predetermined quantization voltages based on a reference voltage, in that said at least one resistor comprises at least two resistors connected in series to the ladder resistor portion and in that the switch means is an analog switch for supplying a voltage at a junction point between the two resistors to an output terminal of the quantization switch portion. When this digital-to-analog converter is incorporated in a digital video signal processing IC provided in a camcorder, the digital input value may correspond to a digital luminance signal while the signal to be added may correspond to a synchronization signal.

BRIEF DESCRIPTION OF THE DRAWINGS

The present invention will be elucidated in conjunction with the accompanying drawing in which.

DETAILED DESCRIPTION OF THE PREFERRED EMBODIMENT

Figure 1:
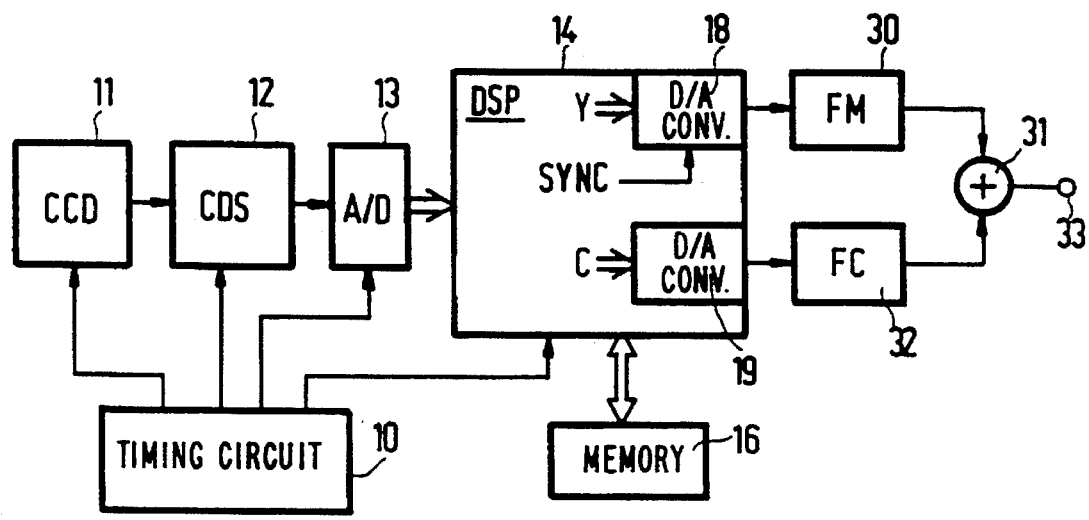
FIG. 1 shows a part of a camcorder with digital video processing comprising a D/A converter according to the present invention.

FIG. 1 shows a pan of a camcorder with a digital video signal processing IC to which a D/A converter according to the present invention is applied. This camcorder comprises a CCD image sensor 11 operative in response to a timing signal from a timing circuit 10, a correlated double sampling (CDS) circuit 12 for processing an output from the image sensor 11 to reduce noise contained therein and an analog-to-digital (A/D) converter 13 for converting an analog video signal from the CDS circuit 12 into a digital signal at a predetermined time interval. An output from the A/D converter 13, i.e., a digital video signal, is supplied to a digital video signal processing circuit (hereinafter referred to simply as "DSP") 14 in the form of an integrated circuit (IC).

The DSP 14 is a circuit for processing the digital video signal in accordance with programs stored in a memory 16 and outputs from a parameter setting circuit (not shown) and has a known structure except for an incorporated D/A converter for a luminance signal which will be described later. The DSP 14 comprises a circuit pan for processing the inputted digital video signal to separate the luminance and chrominance signals Y and C from each other and another circuit part for forming a synchronization signal SYNC based on a timing signal fed from the timing circuit 10. However, these circuit parts are not much relevant to the present invention and will not be described herein. The DSP 14 further comprises a first D/A converter 18 for converting the luminance signal Y digitally processed in this DSP into an analog signal and a second D/A converter 19 for converting the chrominance signal C digitally processed in this DSP into an analog signal.

Figure 2:
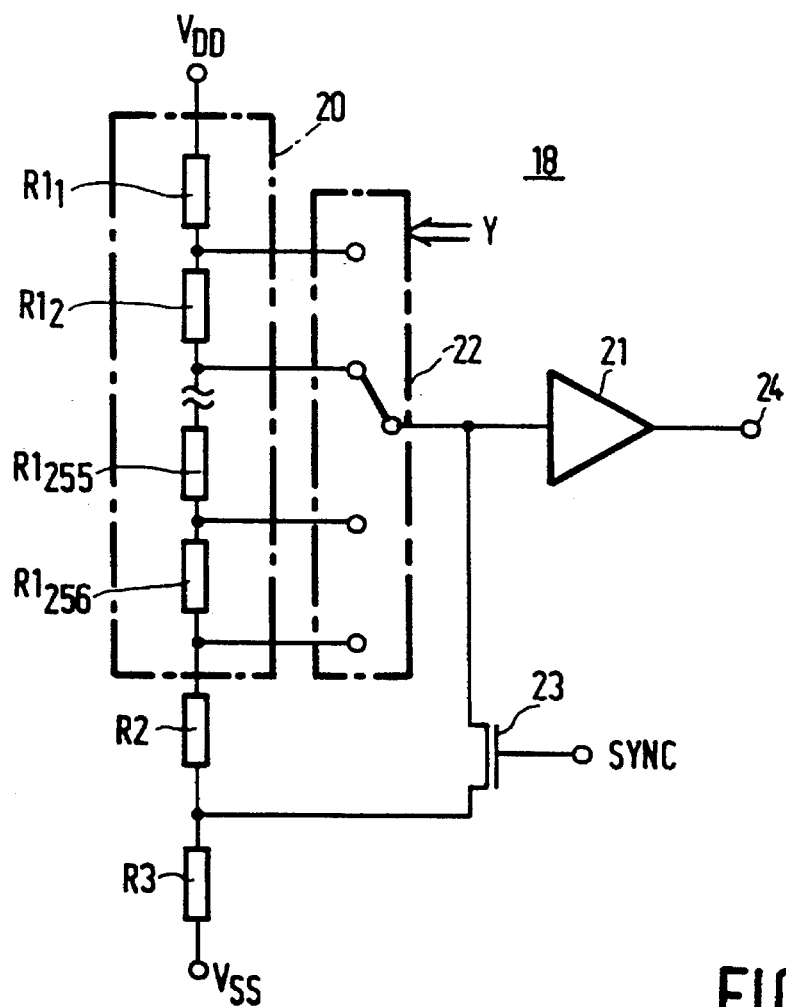
FIG. 2 shows a D/A converter according to the invention.

The above first D/A converter 18 is provided in accordance with the present invention and has a circuit structure as shown in FIG. 2. This D/A converter is of the voltage and ladder-resistor type and comprises a ladder resistor portion or means 20, which includes serially connected two hundred and fifty six resistors $R1_1$ to $R1_{256}$ of the same resistance value (only the resistors $R1_1$, $R1_2$, $R1_{255}$ and $R1_{256}$ are shown in FIG. 2) and is supplied with a first reference voltage $V_{DD}$ at one end. A switch portion 22 selectively connects junction points of the resistors of the ladder resistor portion 20 to an input terminal of an amplifier 21 in accordance with the digital luminance signal Y. The other end of the ladder resistor means 20 in the D/A converter 18 is connected to a terminal of a second reference voltage $V_{SS}$ through resistors R2 and R3 in that order. A junction point of the two resistors R2 and R3 is connected to the input terminal of the amplifier 21 through an analog switch 23 which is composed, for example, of an NMOS transistor controlled by the synchronization signal SYNC. In this case, values of the reference voltages $V_{DD}$ and $V_{SS}$ and values of the resistors $R1_1$ to $R1_{256}$, R2 and R3 are selected in a manner such that a voltage at the junction point of the resistors $R1_1$ and $R1_2$ corresponds to the upper limit level of the luminance signal, i.e., a peak level of whim, a voltage at the junction point of the resistors $R1_{256}$ and R2 corresponds to the lower limit level of the luminance signal, i.e., a black level, and a voltage at the junction point of the resistors R2 and R3 corresponds to a level at a peak of the synchronization signal SYNC. It should be noted here that the ladder resistor portion 20 and the switch portion 22 are shown only diagrammatically for the purpose of simplifying the description, but that the actual circuits of these portions may be slightly different from those shown. It should also be noted that the switching portion 22 may be constructed so that it does not operate during the time when the synchronization signal SYNC is generated.

An output from the above D/A converter 18, i.e., an analog luminance signal obtained at an output terminal 24 of the amplifier 21, is supplied through a frequency modulation circuit 30 shown in FIG. 1 to one input terminal of an adder 31. An analog chrominance signal from the second D/A converter 19 in the DSP 14 is supplied to the other input terminal of the adder 31 through a frequency converter 32. A combined signal obtained at an output terminal of the adder 1 is supplied through an output terminal 33 to a not-shown recording portion of this camcorder. The second D/A converter 19 is of the conventional construction and will not therefore be described herein in detail.

Figure 3:
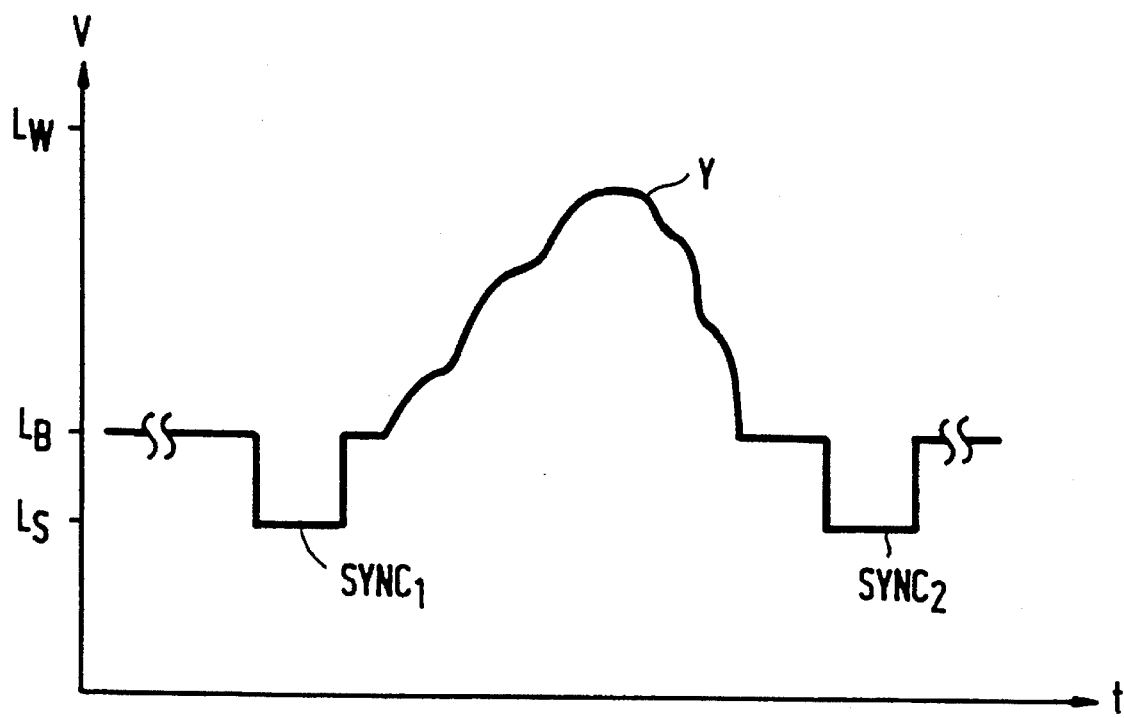
FIG. 3 shows a signal waveform occurring in a D/A converter according to the invention.

The operation of the camcorder of the above structure will now be described mainly in relation to the D/A converter 18. During a horizontal scanning period between two adjacent synchronization signals $SYNC_1$ and $SYNC_2$ such as those shown in FIG. 3, the analog switch 23 in the D/A converter 18 is in the off state and therefore an output voltage of the ladder resistor means 20 selected by the switch means 22 in accordance with the digital luminance signal Y is supplied to the input terminal of the amplifier 21. Thus, the D/A converter 18 outputs an analog signal whose level is situated between the white and black levels $L_W$ and $L_B$ and corresponds to the value of the luminance signal Y in this case. When the synchronization signal SYNC is generated in the DSP 14, the analog switch 23 in the D/A converter 18 is brought into a conduction state and therefore the voltage at the junction point of the resistors R2 and R3, i.e., a voltage whose value corresponds to the predetermined peak level $L_S$ of the synchronization signal, is supplied to the input terminal of the amplifier 21. Thus, a synchronization signal having the peak level $L_S$ ($SYNC_1$ or $SYNC_2$ in FIG. 3) is outputted from the D/A converter 18 in this case.

As will be appreciated from the foregoing, with the above-described structure it is possible to add a synchronization signal to a luminance signal with such a minimum circuit structure that only two resistors are added to the ladder resistor portion 20 in the D/A converter 18 and that an analog switch controlled by the synchronization signal is further provided.

In the above embodiment, the present invention has been applied to a voltage and ladder-resistor type D/A converter. However, it will be obvious for those skilled in the an that the present invention can also be applied to D/A converters of other ladder-resistor types such as a current and ladder-resistor type.

We claim:

1. A digital-to-analog converter comprising: a ladder resistor means for generating a plurality of quantization signals of predetermined values based on a reference signal to derive an analog output signal, a quantization switch means for selectively outputting one of the quantization signals in accordance with a digital input value, at least one resistor coupled to the ladder resistor means for generating a signal whose value corresponds to a desired signal level of a signal to be added to said analog output signal, and a switch means coupled to said at least one resistor for supplying, in response to a timing signal synchronized with said signal to be added, said signal of the value corresponding to the desired signal level to an output terminal of the quantization switch means.

2. A digital-to-analog converter as claimed in claim 1, wherein the ladder resistor means is constructed to generate a plurality of predetermined quantization voltages based on a reference voltage, in that said at least one resistor comprises at least two resistors connected in series to the ladder resistor means and in that said switch means is an analog switch for supplying a voltage produced at a junction point between the two resistors to the output terminal of the quantization switch means.

3. A digital-to-analog converter as claimed in claim 2, the digital input value represents a luminance signal and in that said signal to be added is a synchronization signal.

4. A digital-to-analog converter as claimed in claim 1, wherein the digital input value represents a luminance signal and in that said signal to be added is a synchronization signal.

5. A digital-to-analog converter as claimed in claim 1 wherein said quantization switching means is controlled by a digital input signal to be converted into a corresponding analog output signal.

6. A digital-to-analog converter as claimed in claim 1 wherein said switching means is activated so that the quantization signals are outputted only at time intervals between the occurrence of said timing signals.

7. A digital-to-analog converter for converting a digital input signal into an analog output signal, comprising:

first and second reference voltage terminals for connection to first and second reference voltages, an output terminal for said analog output signal, a ladder resistor network for deriving a plurality of respective analog signals corresponding to respective values of the digital input signal, switching means controlled by said digital input signal and coupled between said ladder resistor network and said output terminal for selectively coupling a derived analog signal to said output terminal as a function of the value of the digital input signal, at least one resistor coupled to the ladder resistor network for deriving a further signal of a value which corresponds to a desired signal level of a signal to be added to the analog output signal, and a switching device coupled to said at least one resistor and said output terminal and controlled by a timing signal synchronized with said signal to be added so as to supply to the output terminal said further signal.

8. The digital-to-analog converter as claimed in claim 7 wherein said ladder resistor network comprises a plurality of series connected resistors connected to said first reference voltage terminal, said digital-to-analog converter further comprising;

a second resistor, means connecting said one resistor and said second resistor in series circuit with said plurality of series connected resistors to said second reference voltage terminal, and means connecting said switching device to a junction point between said one resistor and said second resistor and to said output terminal to supply said further signal to the output terminal.

9. The digital-to-analog converter as claimed in claim 7 wherein said at least one resistor is coupled to the ladder resistor network via a non-switchable coupling means.

10. The digital-to-analog converter as claimed in claim 7 wherein said ladder resistor network comprises a plurality of series connected resistors connected to said first reference voltage terminal, and said at least one resistor is connected to one end of said series connected resistors and to said second reference voltage terminal to form an unbroken series circuit connection of said series connected resistors and said at least one resistor between said first and second reference voltage terminals.

11. The digital-to-analog converter as claimed in claim 7 wherein said at least one resistor is directly connected to said ladder resistor network and to said second reference voltage terminal.

12. The digital-to-analog converter as claimed in claim 7 wherein said at least one resistor is coupled to said output terminal via said switching device in a circuit path that is independent of said switching means.

13. The digital-to-analog converter as claimed in claim 7 wherein said ladder resistor network comprises a plurality of series connected resistors and the resistance value of said at least one resistor is determined by the desired signal level of the signal to be added and independently of the resistance values chosen for said plurality of series connected resistors.

14. The digital-to-analog converter as claimed in claim 7 further comprising:

a second resistor, means connecting said one resistor and said second resistor in series circuit with said ladder resistor network between said first and second reference voltage terminals, and wherein said switching device is coupled between a junction point of said one resistor and said second resistor and said output terminal.

15. The digital-to-analog converter as claimed in claim 7 wherein the digital input signal comprises a luminance signal of a video apparatus and said signal to be added is a synchronization signal.

16. The digital-to-analog converter as claimed in claim 15 further comprising:

a further digital-to-analog converter unit controlled by a digital chrominance signal of the video apparatus, an adder circuit having first and second inputs, a frequency modulator coupled between said output terminal and the first input of the adder circuit, a frequency converter coupled between an output of the further digital to analog converter unit and the second input of the adder circuit, and an output terminal coupled to an output of the adder circuit.

* * * * *